United States Patent
Ding et al.

(10) Patent No.: US 11,469,248 B2
(45) Date of Patent: *Oct. 11, 2022

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Lei Ding, Hubei (CN); Jing Gao, Hubei (CN); Chuan Yang, Hubei (CN); Lan Fang Yu, Hubei (CN); Ping Yan, Hubei (CN); Sen Zhang, Hubei (CN); Bo Xu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/112,496

(22) Filed: Dec. 4, 2020

(65) Prior Publication Data

US 2021/0249436 A1 Aug. 12, 2021

Related U.S. Application Data

(63) Continuation of application No. 16/220,000, filed on Dec. 14, 2018, now Pat. No. 10,868,033, which is a
(Continued)

(30) Foreign Application Priority Data

Nov. 16, 2017 (CN) .......................... 201711138366.5

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC ......... H01L 27/11582; H01L 27/11524; H01L 27/11556; H01L 27/1157
See application file for complete search history.

(56) References Cited

U.S. PATENT DOCUMENTS 8,461,003 B2 6/2013 Joo et al.
9,698,231 B2 7/2017 Namkoog et al.
(Continued)

FOREIGN PATENT DOCUMENTS

CN 102683291 A 9/2012
CN 104167392 A 11/2014
(Continued)

OTHER PUBLICATIONS

International Search Report and Written Opinion of the International Searching Authority directed to related International Patent Application No. PCT/CN2018/112678, dated Jan. 30, 2019; 9 pages.

*Primary Examiner* — Mohammed R Alam
(74) *Attorney, Agent, or Firm* — Sterne, Kessler, Goldstein & Fox P.L.L.C.

(57) ABSTRACT

A three-dimensional (3D) NAND memory device is provided. The device comprises an alternating stack including a plurality of dielectric/conductive layer pairs each comprising a dielectric layer and a conductive layer. The device further comprises a conductive wall vertically penetrating through the alternating stack and extending in a horizontal direction, and a spacer layer on sidewalls of the conductive wall configured to insulate the conductive wall from the conductive layers of the alternating stack. The spacer layer comprises a first spacer sublayer having a first dielectric
(Continued)

material, a second spacer sublayer having a second dielectric material, and a third spacer sublayer having a third dielectric material. The second spacer is sandwiched between the first spacer sublayer and the third spacer sublayer. A second k-value of the second dielectric material is higher than a first k-value of the first dielectric material and higher than a third k-value of the third dielectric material.

19 Claims, 13 Drawing Sheets

Related U.S. Application Data continuation of application No. PCT/CN2018/112678, filed on Oct. 30, 2018.

(51) Int. Cl.
*H01L 27/11524* (2017.01)
*H01L 27/11556* (2017.01)

(56) References Cited

U.S. PATENT DOCUMENTS

| | | | |
|---|---|---|---|
| 2014/0225181 | A1 | 8/2014 | Makala et al. |
| 2014/0353738 | A1 | 12/2014 | Makala et al. |
| 2016/0336338 | A1* | 11/2016 | Song ............... H01L 23/5226 |
| 2017/0271358 | A1* | 9/2017 | Mori ............... H01L 27/11529 |
| 2018/0122742 | A1* | 5/2018 | Ha ................. H01L 27/1157 |
| 2019/0148401 | A1 | 5/2019 | Ding et al. |

FOREIGN PATENT DOCUMENTS

| | | |
|---|---|---|
| CN | 105810638 A | 7/2016 |
| CN | 106024794 A | 10/2016 |
| CN | 106409768 A | 2/2017 |
| CN | 106935592 A | 7/2017 |
| CN | 107968091 A | 4/2018 |
| WO | WO 2017/181945 A1 | 10/2017 |
| WO | WO 2019/095996 A1 | 5/2019 |

* cited by examiner

THREE-DIMENSIONAL MEMORY DEVICES AND FABRICATING METHODS THEREOF

CROSS-REFERENCE TO RELATED APPLICATIONS

This application is a continuation application of U.S. patent application Ser. No. 16/220,000 filed on Dec. 14, 2018, which is a continuation application of International Application No. PCT/CN2018/112678, filed on October 30, which claim priority to Chinese Patent Application No. 201711138366.5, filed on Nov. 16, 2017, all of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device, comprising: forming, on a substrate, an alternating dielectric stack including a plurality of dielectric layer pairs, each of the plurality of dielectric layer pairs comprising a first dielectric layer and a second dielectric layer different from the first dielectric layer; forming a slit penetrating vertically through the alternating dielectric stack and extending in a horizontal direction; removing the plurality of second dielectric layers in the alternating dielectric stack through the slit to form a plurality of horizontal trenches; forming a gate structure in each of the plurality of horizontal trenches; forming a spacer layer on sidewalls of the slit to cover the gate structures, wherein the spacer layer has a laminated structure; and forming a conductive wall in the slit, wherein the conductive wall is insulated from the gate structures by the spacer layer.

In some embodiments, each of the plurality of dielectric layer pairs is formed of a silicon oxide layer having a thickness of about 10 nm to about 150 nm and a silicon nitride layer having a thickness of about 10 nm to about 150 nm.

In some embodiments, the method further comprises: forming a plurality of channel structures, each penetrating vertically through the alternating dielectric stack; wherein the slit extends horizontally between the plurality of channel structures.

In some embodiments, the method further comprises: after forming the slit, forming a doped region below the slit in the substrate; before forming the conductive wall, removing a portion of the spacer layer at a bottom of the silt to expose the doped region; and forming the conductive wall in the silt, so as to contact the conductive wall with the doped region.

In some embodiments, forming the plurality of channel structures comprises: forming a channel hole extending vertically through the alternating dielectric stack; forming a functional layer on a sidewall of the channel hole; and forming a channel layer covering a sidewall of the functional layer.

In some embodiments, forming the functional layer comprises: forming a barrier layer on a sidewall of the channel hole for blocking an outflow of the electronic charges during operation; forming a storage layer on a surface of the barrier layer for storing electronic charges during operation; and forming a tunneling layer on a surface of the storage layer for tunneling electronic charges during operation.

In some embodiments, the method further comprises: before forming the gate structure in each of the plurality of horizontal trenches, forming an insulating layer in the plurality of horizontal trenches.

In some embodiments, forming the spacer layer comprises: forming a second spacer sublayer having a second dielectric material between a first spacer sublayer having a first dielectric material and a third spacer sublayer having a third dielectric material; wherein a second k-value of the second dielectric material is higher than a first k-value of the first dielectric material and higher than a third k-value of the third dielectric material.

In some embodiments, forming the spacer layer comprises: forming the first spacer sublayer covering the sidewalls of the slit by performing a first atomic layer deposition process to deposit a low temperature oxide material; forming the second spacer sublayer covering the first spacer sublayer by performing a second atomic layer deposition process to deposit a nitride material; and forming the third spacer sublayer covering the second spacer sub-layer by performing a third atomic layer deposition process to deposit a low temperature oxide material or a high temperature oxide material.

In some embodiments, the method further comprises: before forming the spacer layer, removing portions of the gate structures adjacent to the sidewalls of the slit; and forming the first spacer sublayer and the second spacer sublayer each having a plurality of recesses, each recess corresponding to a gate structure.

In some embodiments, the method further comprises: performing an implantation process to treat exposed surfaces of the spacer layer.

In some embodiments, the method further comprises: implanting titanium ions or titanium nitride ions into at least a portion of the third spacer sub-layer.

Another aspect of the present disclosure provides a three-dimensional (3D) NAND memory device, comprising: an alternating dielectric/conductive stack including a plurality of dielectric/conductive layer pairs on a substrate, each of the plurality of dielectric/conductive layer pairs comprising a dielectric layer and a conductive layer; a slit penetrating vertically through the alternating dielectric/conductive stack and extending in a horizontal direction; a conductive wall in the slit; and a spacer layer on sidewalls of the silt configured to insulate the conductive wall from the plurality of conductive layers of the alternating dielectric/conductive stack, wherein the spacer layer has a laminated structure.

In some embodiments, each of the dielectric layers is silicon oxide having a thickness in a range from about 10 nm to about 150 nm; each of the conductive layers is tungsten having a thickness in a range from about 10 nm to about 150 nm; and the conductive wall includes tungsten.

In some embodiments, the device further comprises: a doped region below the slit in the substrate, wherein the conductive wall is in contact with the doped region at a bottom of the slit.

In some embodiments, the device further comprises: a plurality of channel structures, each penetrating vertically through the alternating dielectric/conductive stack; wherein the slit extends horizontally between the plurality of channel structures.

In some embodiments, each of the plurality of channel structures comprises: a channel hole extending vertically through the alternating dielectric/conductive stack; a functional layer on a sidewall of the channel hole; and a channel layer covering a sidewall of the functional layer.

In some embodiments, the functional layer comprises: a barrier layer on a sidewall of the channel hole configured to block an outflow of the electronic charges during operation; a storage layer on a surface of the barrier layer configured to store electronic charges during operation; and a tunneling layer on a surface of the storage layer configured to tunnel electronic charges during operation.

In some embodiments, the device further comprises: an insulating layer between the each dielectric layer and each conductive layer, and between the conductive layers and the functional layer.

In some embodiments, the spacer layer having the laminated structure comprises: a first spacer sublayer having a first dielectric material; a second spacer sublayer having a second dielectric material; and a third spacer sublayer having a third dielectric material; wherein the second spacer is sandwiched between the first spacer sublayer and the third spacer sublayer, and a second k-value of the second dielectric material is higher than a first k-value of the first dielectric material and higher than a third k-value of the third dielectric material.

In some embodiments, the first dielectric material is a low temperature oxide material; the second dielectric material is a nitride material; and the third dielectric material is a low temperature oxide material or a high temperature oxide material.

In some embodiments, the first spacer sublayer and the second spacer sublayer both have a plurality of recesses, each recess corresponding to one of the plurality of conductive layers.

In some embodiments, the device further comprises: an isolation film including titanium or titanium nitride disposed between the third spacer sub-layer and the conductive wall.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
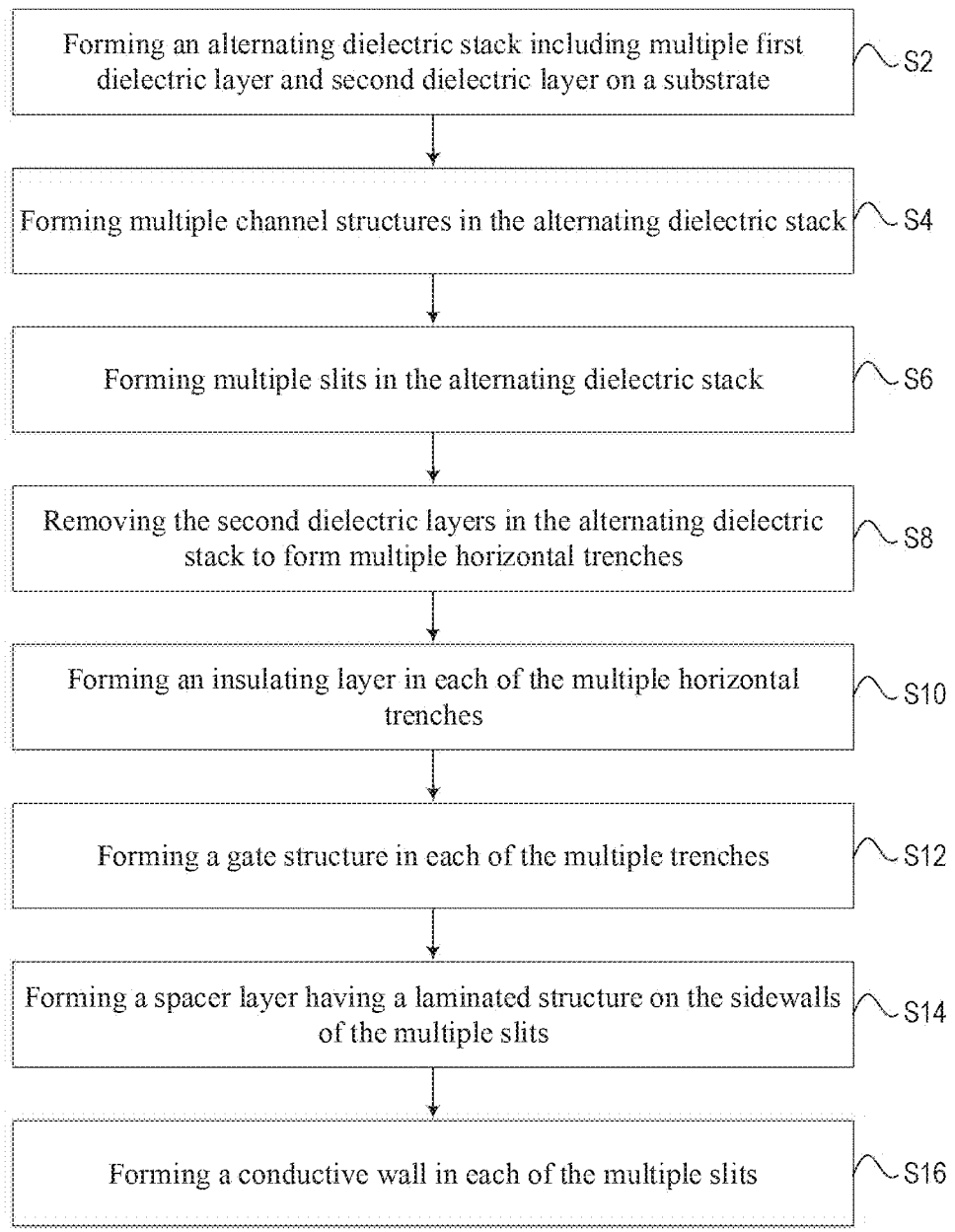
FIG. 1 illustrates a flow diagram of an exemplary method for forming a 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

Various embodiments in accordance with the present disclosure provide a gate-last process for forming a gate structure of a 3D memory device. In the disclosed method, after forming a multi-layer gate structure, and before forming an isolation layer (e.g. a silicon oxide layer) on the sidewall of slits, an additional isolation layer (e.g. a silicon film) can be formed to cover the exposed surfaces of the multi-layer gate structure to prevent the exposed surfaces of the multi-layer gate structure from being oxidized during the deposition of the silicon oxide layer. As such, a leakage between the multi-layer gate structure and conductive wall in the slit can be eliminated.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Typically, a slit is provided between multiple NAND strings. A metal wall (e.g., a tungsten (W) wall) filled in the slit is used as an array common source (ACS) of the multiple NAND strings. Generally, an oxide layer is deposited between the gates (e.g., W gates) of the multiple NAND strings and the metal wall (e.g., W wall) as a spacer layer. However, the low temperature oxide (LTO) material used as the spacer layer has a poor deposition quality and a low deposition density, leading a low breakdown voltage between the gates (e.g., W gates) of the multiple NAND strings and the metal wall (e.g., W wall), thereby resulting in a poor electrical performance of the 3D memory device.

Accordingly, a method for forming a 3D memory device is provided to improve the quality of the spacer layer between the gates and the metal wall. By improving the deposition filling mode of the spacer layer, the method can significantly improve the isolation performance of the spacer layer, thereby increasing the breakdown voltage between the gates and the metal wall.

FIG. 1 illustrates a flow diagram of an exemplary method for forming a 3D memory device, according to some embodiments of the present disclosure. FIGS. 2-13 illustrate schematic cross-sectional views of an exemplary 3D memory device at certain fabricating stages of the method shown in FIG. 1 according to some embodiments of the present disclosure.

As shown in FIG. 1, the method starts at operation S2, in which an alternating dielectric stack is formed on a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc.

Figure 2:
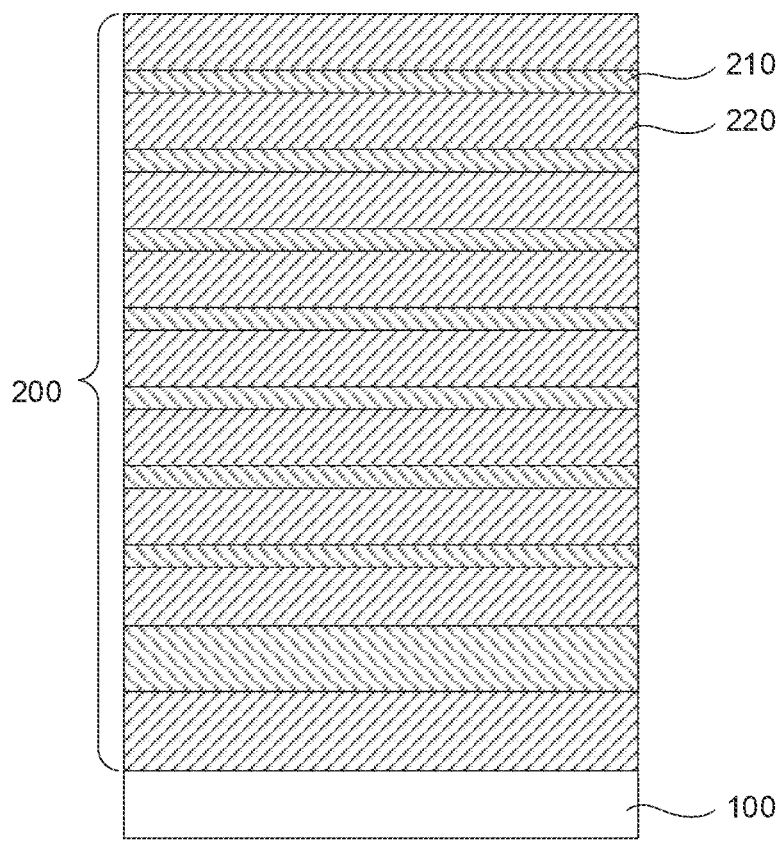
FIGS. 2-13 illustrate schematic cross-sectional views of an exemplary 3D memory device at certain fabricating stages of the method shown in FIG. 1 according to some embodiments of the present disclosure.

As shown in FIG. 2, an alternating dielectric stack 200 including a plurality of dielectric layer pairs can be formed on the substrate 100. Each dielectric layer pairs of the alternating dielectric stack 200 can include an alternating stack of a first dielectric layer 210 and a second dielectric layer 220 that is different from first dielectric layer 210. In some embodiments, the first dielectric layers 210 can be used as insulating layers, and the second dielectric layer 220 can be used as sacrificial layers, which are to be removed in the subsequent processes.

The plurality of first dielectric layers 210 and second dielectric layers 220 are extended in a lateral direction that is parallel to a surface of the substrate 100. In some embodiments, there are more layers than the dielectric layer pairs made of different materials and with different thicknesses in the alternating dielectric stack 200. The alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 200 can include a plurality of oxide/nitride layer pairs. Each dielectric layer pair includes a layer of silicon oxide 210 and a layer of silicon nitride 220. The plurality of oxide/nitride layer pairs are also referred to herein as an "alternating oxide/nitride stack." That is, in the alternating dielectric stack 200, multiple oxide layers 210 and multiple nitride layers 220 alternate in a vertical direction. In other words, except a top and a bottom layer of a given alternating oxide/nitride stack, each of the other oxide layers 210 can be sandwiched by two adjacent nitride layers 220, and each of the nitride layers 220 can be sandwiched by two adjacent oxide layers 210.

Oxide layers 210 can each have the same thickness or have different thicknesses. For example, a thickness of each oxide layer can be in a range from about 10 nm to about 150 nm. Similarly, nitride layers 220 can each have the same thickness or have different thicknesses. For example, a thickness of each nitride layer can be in a range from about 10 nm to about 150 nm. In some embodiments, a total thickness of the alternating dielectric stack 200 can be larger than 1000 nm.

It is noted that, in the present disclosure, the oxide layers 210 and/or nitride layers 220 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 200 can include any suitable number of layers of the oxide layers 210 and the nitride layers 220. In some embodiments, a total number of layers of the oxide layers 210 and the nitride layers 220 in the alternating dielectric stack 200 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. For example, a bottom layer and a top layer in the alternating dielectric stack 200 can be oxide layers 210.

As shown in FIG. 1, the method proceeds to operation S4, in which multiple channel structures can be formed in the alternating dielectric stack. Each channel structure can include a channel hole 300 extending vertically through the alternating dielectric stack 200, an epitaxial layer 340 on a bottom of the channel hole 300, a functional layer 310 on the sidewall of the channel hole 300, and a channel layer 320 between the functional layer, a filling structure 330, and a channel plug 350 on a top of the channel hole 300. The multiple channel structures can be arranged as an array in the alternating dielectric stack 200. For example, a number of the multiple channel structures can be $1, 2^2, 3^2, \ldots, (1+n)^2$, where n is an integer large than 1.

Figure 3:
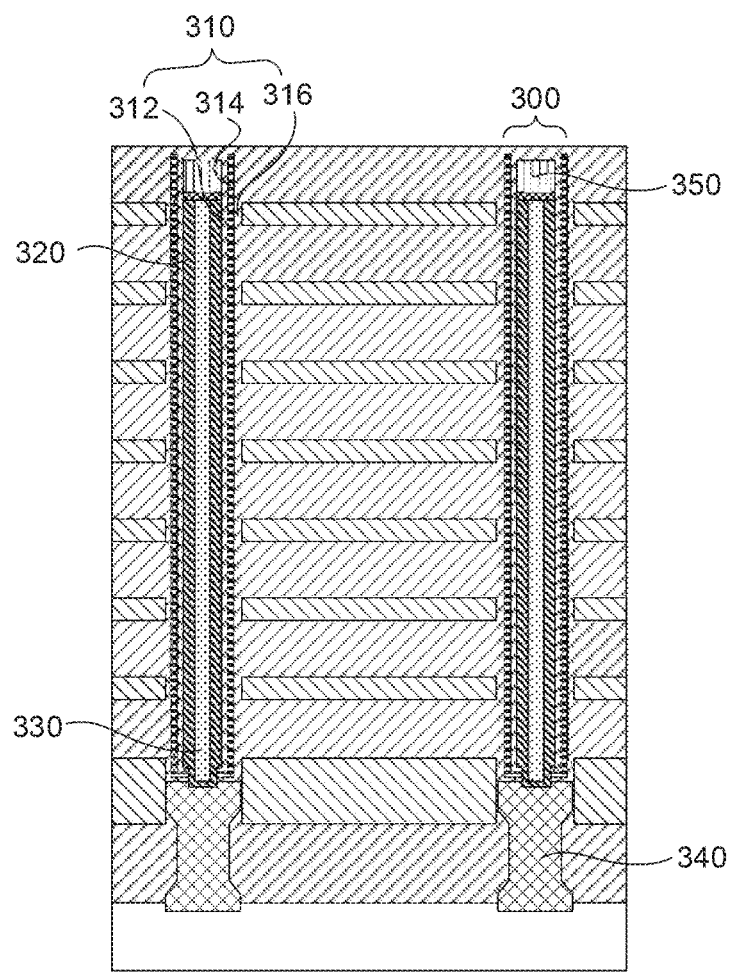

As shown in FIG. 3, in some embodiments, fabrication processes to form the channel structure include forming a channel hole 300 that extends vertically through the alternating dielectric stack 200. The channel hole 300 can have a high aspect ratio, and can be formed by etching the alternating dielectric stack 200, and a subsequent cleaning process. The etching process to form the channel hole 300 can be a wet etching, a dry etching, or a combination thereof.

In some embodiments, fabrication processes to form the channel structure include forming an epitaxial layer 340 at a bottom of the channel hole 300. In some embodiments, the epitaxial layer 340 can be a polycrystalline silicon (polysilicon) layer formed by using a selective epitaxial growth (SEG) process. For example, an SEG pre-clean process can be performed to clean the multiple channel holes 300. A following deposition process can be performed to form a polysilicon layer at the bottom of each channel hole 300. In some embodiments, any suitable doping process, such as an ion metal plasma (IMP) process, can be performed on the polysilicon layer to form the epitaxial layer 340. In some embodiments, the epitaxial layer 340 may be not directly formed on the surface of the substrate 100. One or more layers can be formed between the epitaxial layer 340 and the substrate 100. That is, the epitaxial layer 340 overlays the substrate 100.

In some embodiments, fabrication processes to form a functional layer 310 on the sidewall of the channel hole 300. The functional layer can be a composite dielectric layer, such as a combination of a barrier layer 312, a storage layer 314, and a tunneling layer 316. The functional layer 310, including the barrier layer 312, the storage layer 314, and the tunneling layer 316, can be formed by one or more thin film deposition processes, such as ALD, CVD, PVD, any other suitable processes, or any combination thereof.

As shown in FIG. 3aa, the barrier layer 312 can be formed between the storage layer 314 and the sidewall of the channel hole 300. The barrier layer 213 can be used for blocking the outflow of the electronic charges. In some embodiments, the barrier layer 312 can be a silicon oxide layer or a combination of silicon oxide/silicon nitride/silicon oxide (ONO) layers. In some embodiments, the barrier layer 312 includes high dielectric constant (high k-value) dielectrics (e.g., aluminum oxide). In some embodiments, a thickness of the barrier layer 312 can be in a range from about 3 nm to about 20 nm.

The storage layer 314 can be formed between the tunneling layer 316 and the barrier layer 312. Electrons or holes from the channel layer can tunnel to the storage layer 314 through the tunneling layer 316. The storage layer 314 can be used for storing electronic charges (electrons or holes) for memory operation. The storage or removal of charge in the storage layer 314 can impact the on/off state and/or a conductance of the semiconductor channel. The storage layer 314 can include one or more films of materials including, but are not limited to, silicon nitride, silicon oxynitride, a combination of silicon oxide and silicon nitride, or any combination thereof. In some embodiments, the storage layer 314 can include a nitride layer formed by using one or more deposition processes. In some embodiments, a thickness of the storage layer 314 can be in a range from about 3 nm to about 20 nm.

The tunneling layer 316 can be formed on the sidewall of the storage layer 314. The tunneling layer 316 can be used for tunneling electronic charges (electrons or holes). The tunneling layer 316 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 316 can be in a range from about 3 nm to about 20 nm.

In some embodiments, fabrication processes to form the channel structure further include forming a channel layer 320 covering the sidewall of the functional layer 310. In some embodiments, the channel layer 320 can be an amorphous silicon layer or a polysilicon layer formed by using a thin film deposition process, such as ALD, CVD, PVD, or any other suitable process. In some embodiments, a thickness of the channel layer 320 can be in a range from about 5 nm to 20 nm.

In some embodiments, fabrication processes to form the channel structure further include forming a filling structure 330 to cover the channel layer 320 and fill the channel hole 310. In some embodiments, the filling structure 330 can be an oxide layer formed by using any suitable deposition process, such as ALD, CVD, PVD, etc. In some embodiments, the filling structure 330 can include one or more airgaps.

In some embodiments, fabrication processes to form the channel structure further include forming a channel plug 350 at a top of the channel hole 300. The channel plug 350 can be in contact with the channel layer 320. The material of the channel plug 350 can include any suitable conductive material, such as Si, W, etc. The channel plug 350 can be formed by using any suitable deposition process, and a following chemical-mechanical planarization (CMP) process.

Figure 4:
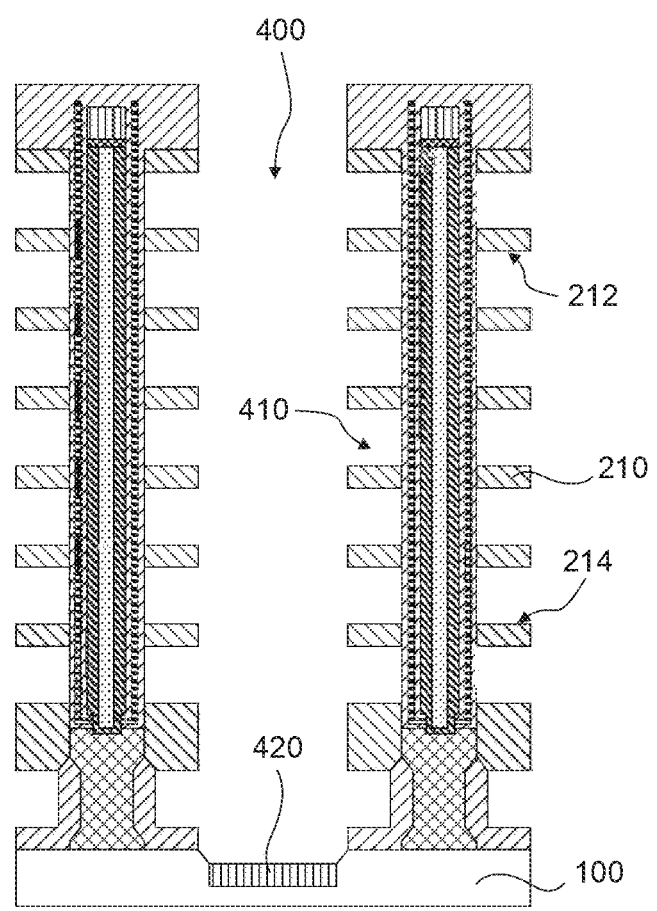

As shown in FIG. 1, the method proceeds to operation S6, in which multiple slits can be formed in the alternating dielectric stack. As shown in FIG. 4, each slit 400 can vertically penetrate through the alternating dielectric stack 200, and extend substantially in a straight line between two arrays of channel structures. The multiple slits 400 can be formed by forming a mask layer over the alternating dielectric stack 200 and patterning the mask using, e.g., photolithography, to form openings corresponding to the multiple slits in the patterned mask layer. A suitable etching process, e.g., dry etch and/or wet etch, can be performed to remove portions of the alternating dielectric stack 200 exposed by the openings until the multiple expose the substrate 100. The mask layer can be removed after the formation of the multiple slits.

In some embodiments, a doped region 420 can be formed at a bottom of each silt 400 by using any suitable doping process, such as ion implantation and/or thermal diffusion through the slits 400. The dopant in doped region 420 can be any suitable N+ or P+ ions. After forming a conductive wall in each silt 400 in a subsequent process, the lower end of each conductive wall can be in contact with a corresponding doped region 420. It is understood that doped regions can be formed in an earlier fabrication stage, for example, prior to the formation of the multi-layer gate structure, according to some embodiments.

As shown in FIG. 1, the method proceeds to operation S8, in which the second dielectric layers 220 in the alternating dielectric stack 200 can be removed to form multiple horizontal trenches 410. As shown in FIG. 4, the multiple horizontal trenches 410 can extend in a horizontal direction, and can be used as spaces for a gate structure to be formed in the subsequent processes. It is noted that, the term "horizontal/horizontally" used herein means nominally parallel to a lateral surface of a substrate.

As described above, the second dielectric layers 220 in the alternating dielectric stack 200 are used as sacrificial layers, and are removed by used any suitable etching process, e.g., an isotropic dry etch or a wet etch. The etching process can have sufficiently high etching selectivity of the material of the second dielectric layers 220 over the materials of the first dielectric layer 210, such that the etching process can have minimal impact on the first dielectric layer 210. The isotropic dry etch and/or the wet etch can remove second dielectric layers 220 in various directions to expose the top and bottom surfaces of each first dielectric layer 210. As such, multiple horizontal trenches 410 can then be formed between first dielectric layers 210.

In some embodiments, the second dielectric layers 220 include silicon nitride and the etchant of the isotropic dry etch includes one or more of $CF_4$, $CHF_3$, $C_4F_8$, $C_4F_6$, and $CH_2F_2$. The radio frequency (RF) power of the isotropic dry etch can be lower than about 100W and the bias can be lower than about 10V. In some embodiments, the second dielectric layers 220 include silicon nitride and the etchant of the wet etch includes phosphoric acid.

After the second dielectric layers 220 are removed, the multiple slits 400 and multiple horizontal trenches 410 can be cleaned by using any suitable cleaning process. For example, a phosphoric acid rinsing process can be performed to remove the impurities on the inner wall of the horizontal trenches 410. In some embodiments, a rinsing temperature can be in a range from about 100° C. to about 200° C., and a rinsing time can be in a range from about 10 minutes to about 100 minutes. After the cleaning process, the top surfaces 212 and bottom surfaces 214 of the first dielectric layers 210, and the outside sidewall portions of functional layers 310 originally surrounded by the second dielectric layers 220 can be exposed through the multiple horizontal trenches 410.

As shown in FIG. 1, the method proceeds to operation S10, in which an insulating layer 600 can be formed in each of the multiple horizontal trenches 410. The insulating layer can be used as a gate dielectric layer for insulating the respective word line (i.e., gate electrode) formed in the subsequent processes from the adjacent first dielectric layer 212.

In some embodiments, the insulating layer can be formed to cover the exposed surfaces of the horizontal trenches 410 as shown in FIG. 4 with one or more suitable insulating materials. For example, one or more suitable deposition processes, such as CVD, PVD, and/or ALD, can be utilized to deposit the one or more insulating materials into the horizontal trenches 410. In some embodiments, a recess etch and/or a chemical-mechanical planarization (CMP) can be used to remove excessive insulating material(s). The one or more insulating materials can include any suitable materials that provide electric insulating function. For example, the one or more insulating materials can include silicon oxide, silicon nitride, silicon oxynitride, aluminum oxide, titanium nitride, etc., and/or any suitable combinations thereof. In some embodiments, multiple insulating layers can have different insulating materials.

In some embodiments, the insulating layer can have a laminated structure. For example, the insulating layer can include a first insulating sub-layer covering the top surfaces 212 and bottom surfaces 214 of the first dielectric layers 210, and the outside sidewall portions of functional layers 310 that are exposed by the multiple horizontal trenches 410. The insulating layer can further include a second insulating sub-layer covering the surfaces of the first insulating sub-layer. In some embodiments, the first insulating sub-layer can include high dielectric constant (high k-value) dielectrics (e.g., aluminum oxide), and the second insulating sub-layer can include titanium nitride as a glue layer to prevent following gate electrode layers from peeling.

In some other embodiments, the insulating layer can be a single film structure. For example, the insulating layer can include a single high k-value dielectric layer (e.g., titanium nitride film) covering the top surfaces 212 and bottom surfaces 214 of the first dielectric layers 210, and the outside sidewall portions of functional layers 310 that are exposed by the multiple horizontal trenches 410. A thickness of the titanium nitride film can be in a range from about 1 nm to about 10 nm.

Figure 5:
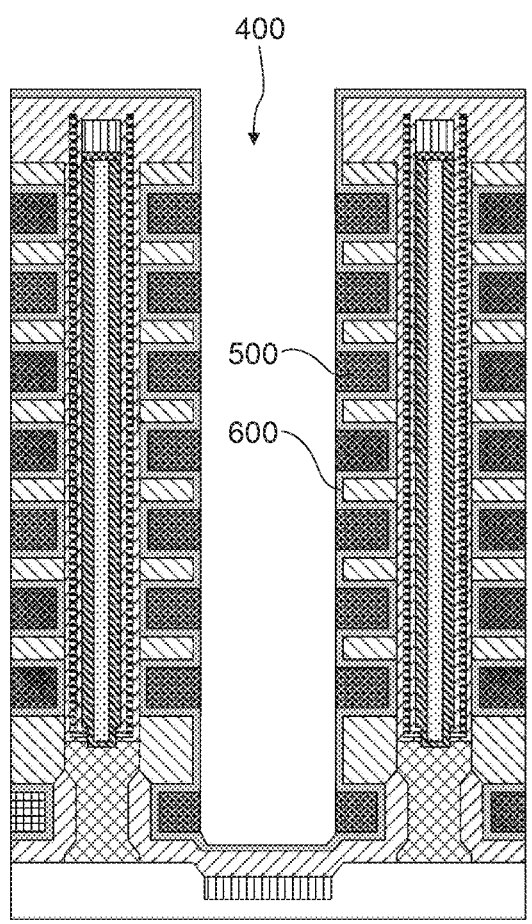

As shown in FIG. 1, the method proceeds to operation S12, in which a gate structure can be formed in each horizontal trench 410. The gate structure can be formed by filling the horizontal trenches 230 with a suitable gate electrode metal material. As shown in FIG. 5, the gate electrode metal material can fill each horizontal trench 410 to form multilplegate structures 500 in the multiple horizontal trench 410. The gate structures 500 can provide the base material for the subsequently-formed word lines (i.e., gate electrodes). The gate electrode metal material can include any suitable conductive material, e.g., tungsten, aluminum, copper, cobalt, or any combination thereof, for forming the word lines (i.e., gate electrodes). The gate electrode material can be deposited into horizontal trenches 410 using a suitable deposition method such as CVD, physical vapor deposition (PVD), plasma-enhanced CVD (PECVD), sputtering, metal-organic chemical vapor deposition (MOCVD), and/or ALD. In some embodiments, the conductive layers 530 include tungsten formed by CVD.

Figure 6:
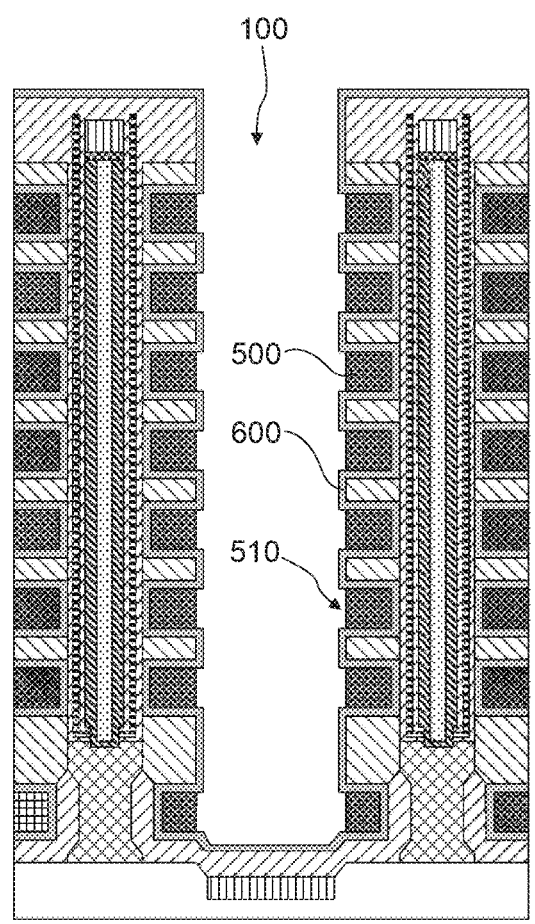

In some embodiments, after forming the multiple gate structures 500, portions of the multiple gate structures 500 can be removed by a recess etching process. In some embodiments, in order to ensure the insulation between multiple gates, a recess etching process, such as a wet etching process, can be performed to remove the exposed portions of the multiple gate structures 500 that are. In doing so, a recess 510 can be formed in each horizontal trench 410 adjacent to the sidewalls of the silt 400, as shown in FIG. 6.

The remaining portions of the multiple gate structures 500 each is sandwiched by the insulating layer 600.

Figure 10:
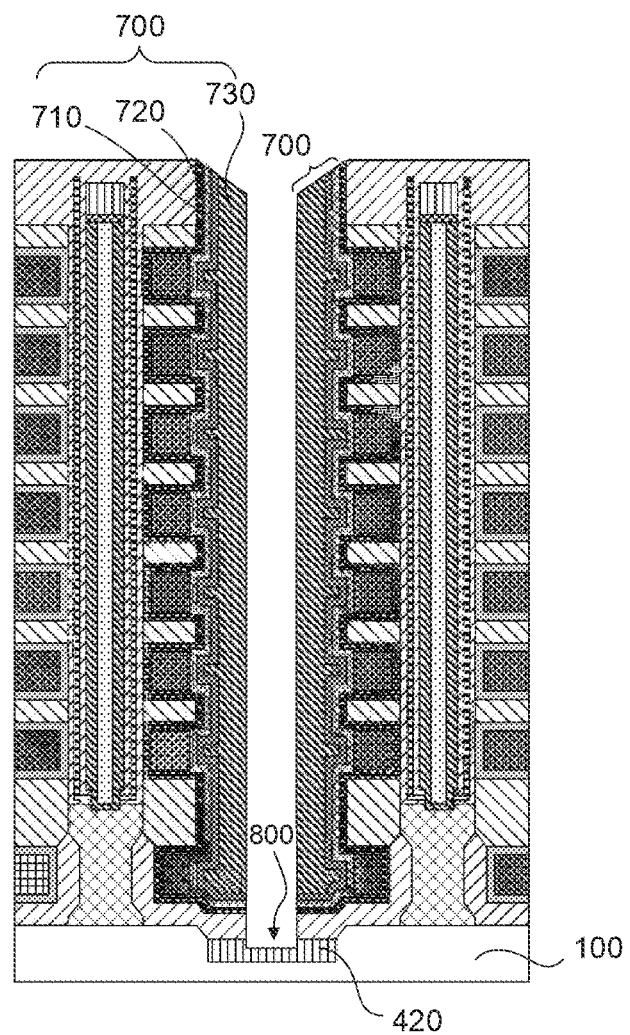

As shown in FIG. 1, the method proceeds to operation S14, in which a spacer layer 700 having a laminated structure can be formed on the sidewalls of the multiple slits 400. The spacer layer 700 is also referred as a gate line spacer (GLSP) layer, and can include a first spacer sublayer 710, a second spacer sublayer 720, and a third spacer sublayer 730, as shown in FIG. 10. The spacer layer 700 can be used to provide electrical insulation between the multiple gates 500 and a conductive wall formed in a subsequent process.

Figure 7:
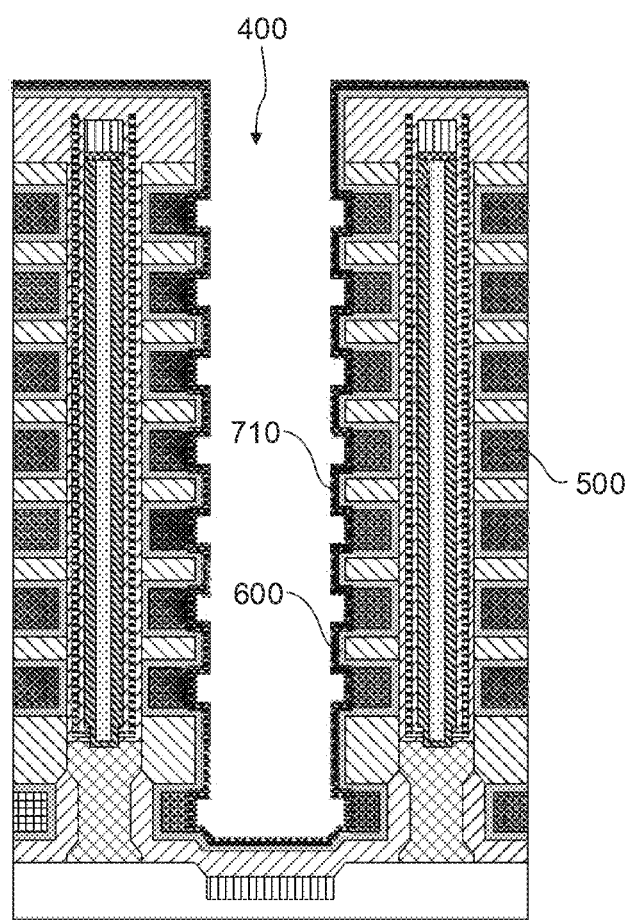

In some embodiments, the fabricating process for forming spacer layer 700 can include forming the first spacer sublayer 710 on the sidewalls of the multiple slits 400. As shown in FIG. 7, the first spacer sublayer 710 can cover the sidewall of the slit 400, the exposed surfaces of the insulating layer 600, and the exposed surfaces of the multiple gate structures 500. The first spacer sublayer 710 can be formed by using any suitable deposition process, such as an atomic layer deposition (ALD) process, to deposit a low temperature oxide material, such as silicon oxide. The first spacer sublayer 710 can be used to prevent the multiple gates structures 500 from being oxidized in the subsequent processes. In some embodiments, a thickness of the first spacer sublayer 710 can be in a range from about 0.1 nm to about 10 nm.

Figure 8:
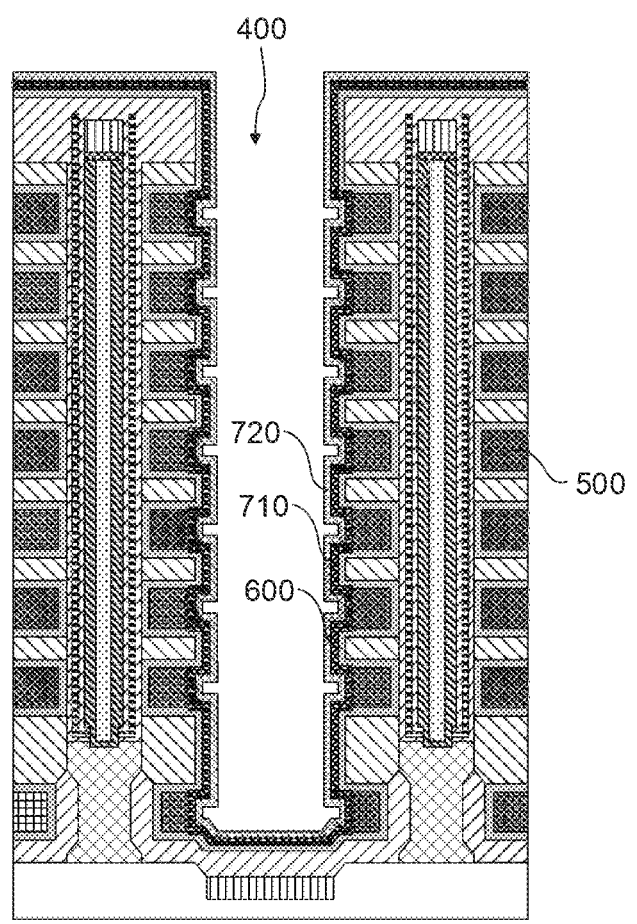

In some embodiments, the fabricating process for forming spacer layer 700 can include forming the second spacer sublayer 720 to cover the first spacer sublayer 710, as shown in FIG. 8. The second spacer sublayer 720 can be formed by using any suitable deposition process, such as an atomic layer deposition (ALD) process, to deposit a high k-value material, such as a dielectric material having a k-value larger than 5. For example, the second spacer sublayer 720 can be a nitride material, such as a silicon nitride layer. In some embodiments, a thickness of the second spacer sublayer 720 can be in a range from about 1 nm to about 10 nm.

Since both the first spacer sublayer 710 and the second spacer sublayer 720 are formed after the recess etching process of the multiple gate structures 500 and have a comparatively small thickness, the first spacer sublayer 710 and the second spacer sublayer 720 also include multiple recesses corresponding to the recesses 510, as shown in FIGS. 7 and 8.

Figure 9:
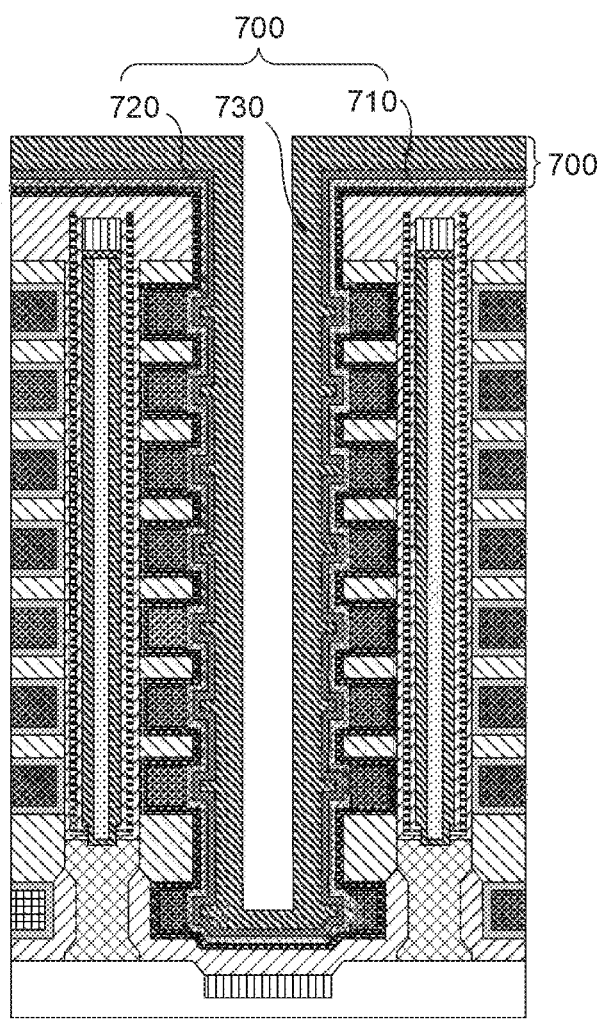

In some embodiments, the fabricating process for forming spacer layer 700 can include forming the third spacer sublayer 730 to cover the second spacer sublayer 720, as shown in FIG. 9. The third spacer sublayer 730 can be formed by using any suitable deposition process, such as an atomic layer deposition (ALD) process to deposit a low temperature oxide material or a high temperature oxide material. A material of the third spacer sublayer 730 can include any suitable insulating material that is different from the material of the second spacer sublayer 720, such as silicon oxide, etc. In some embodiments, a thickness of the third spacer sublayer 730 can be in a range from about 2 nm to about 10 nm.

It is noted that, the spacer layer 700 has a laminated structure, wherein the second spacer sublayer 720 is sandwiched by the first spacer sublayer 710 and the third spacer sublayer 730. The dielectric material of the second spacer sublayer 720 can have a relatively high k-value, such as a k-value higher than 5. The dielectric material(s) of the first spacer sublayer 710 and the third spacer sublayer 730 can have a relatively low k-value, such as a k-value lower than 4. Such laminated structure can efficiently increase the equivalent oxide thickness (EOT) of the spacer layer 700, thereby improving the isolation performance of the spacer layer 700. For example in some embodiments, an EOT of the spacer layer 700 can be in a range from 40 nm to 100 nm. Thus, the improved film quality of the spacer layer 700 can result in a higher breakdown voltage between the gate structures 500 and an array common source (e.g., a conductive wall) formed in a subsequent process.

In some embodiments, after the spacer layer 700 including the first spacer sublayer 710, the second spacer sublayer 720, and the third spacer sublayer 730 is formed, an etching process can be performed to shaping the spacer layer 700. For example, as shown in FIG. 10, portions of the spacer layer 700 at the bottom of each slit 400 can be removed to expose the doping region 420 of the substrate 100. In some embodiments, a groove 800 can be formed the doping region 420 of the substrate 100. Further, portions of the spacer layer 700 that are outside the multiple slits 400 can be removed in the same etching process. As such, the spacer layer 700 can be formed on the sidewalls of the multiple slits 400.

Figure 11:
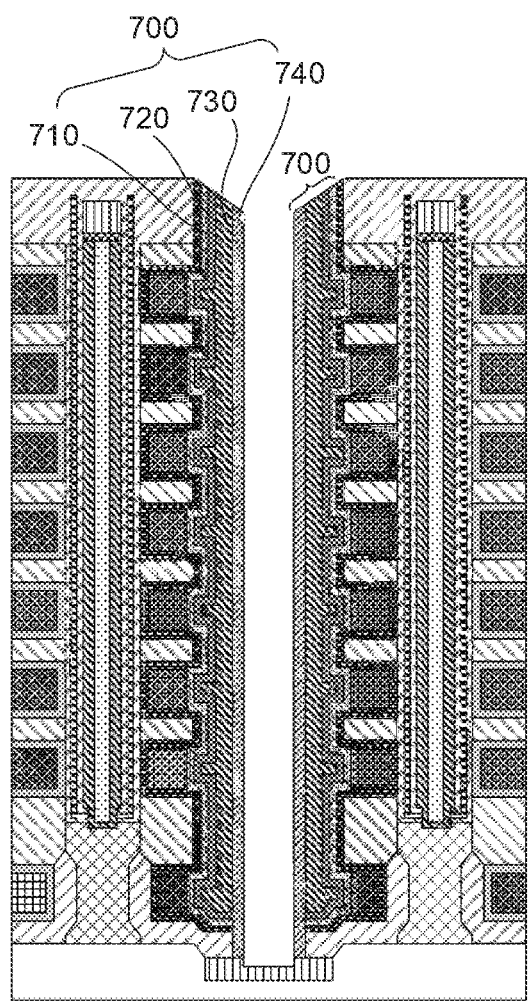

In some embodiments, the fabricating process for forming spacer layer 700 can further include performing an implantation (IMP) process to treat the exposed surface of the spacer layer 700. As such, an isolation film 740 can be formed on the sidewalls of each silt 400, as shown in FIG. 11. In some embodiment, the IMP process can implant titanium ions and/or titanium nitride ions to the exposed surface of the spacer layer 700, such that at least a portion of the third spacer sublayer 730 is transformed to the isolation film 740, which can have a SiO/Ti/TiN composite structure.

Figure 12:
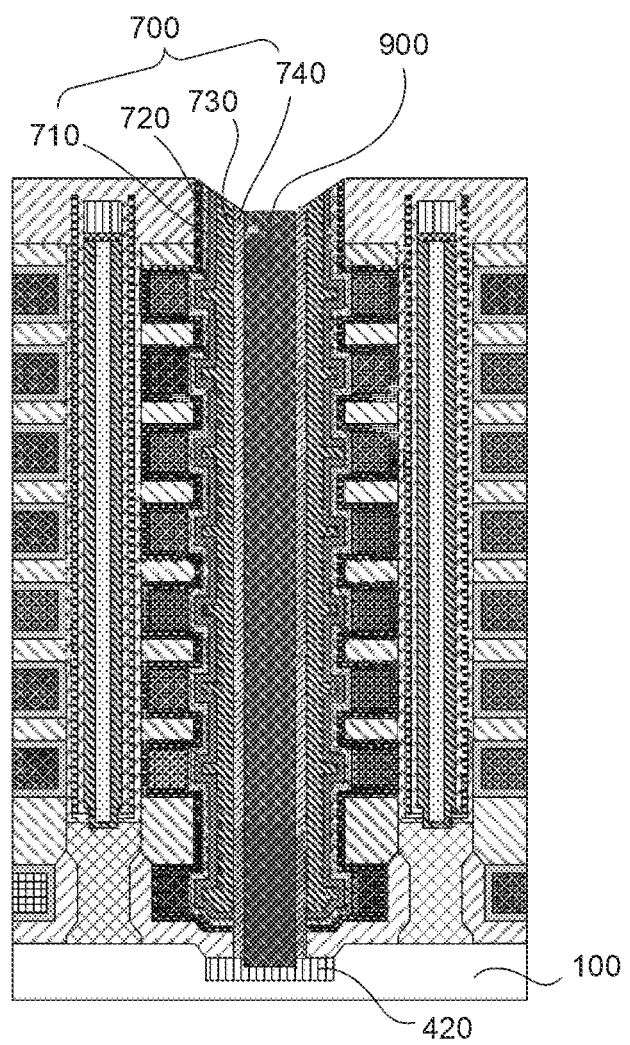
Figure 13:
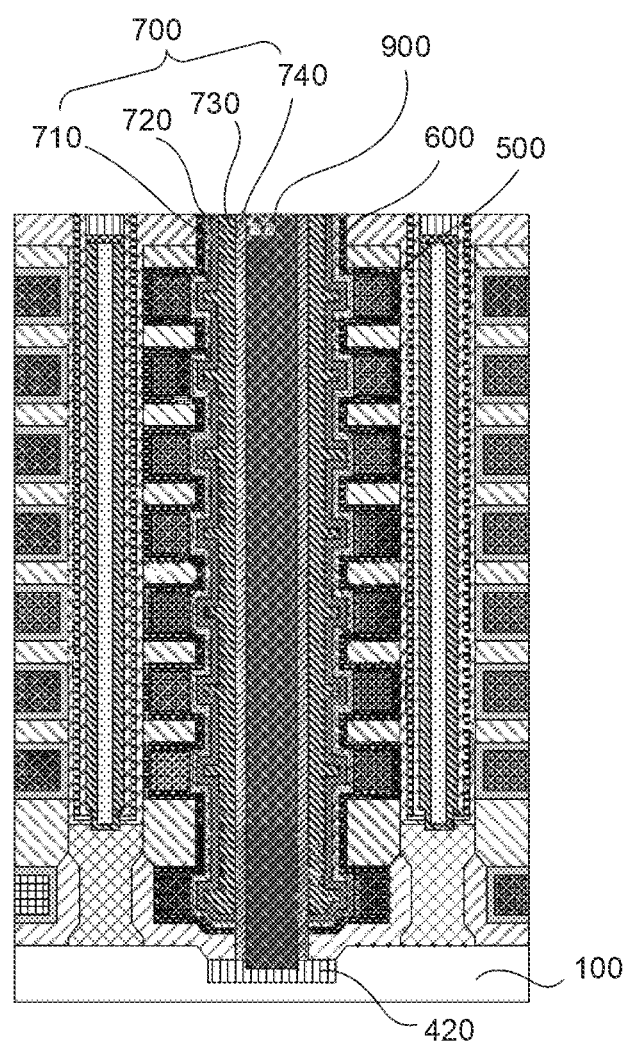

As shown in FIG. 1, the method proceeds to operation S16, in which a conductive wall can be formed in each of the multiple slits 400. As shown in FIG. 12, the conductive wall 900 can be sandwiched between second isolation layers 700 in each slit 400. In some embodiments, the conductive wall 900 can be formed by depositing any suitable conductive material, such as metal materials including tungsten, aluminum, copper, polysilicon, silicides, and/or combinations thereof, etc. The conductive material can be deposited into slits 400 using a suitable deposition method such as CVD, physical vapor deposition (PVD), plasma-enhanced CVD (PECVD), sputtering, metal-organic chemical vapor deposition (MOCVD), and/or ALD. In some embodiments, the conductive walls 800 include tungsten formed by CVD. The conductive wall 900 is in contact with the doped region 420 at the bottom of silt 400, and is used as an array common source (ACS) of the multiple NAND strings. After forming the conductive wall 900, a chemical-mechanical planarization (CMP) process can be performed to planarize the top surface of the formed structure, as shown in FIG. 13.

Accordingly, a method for forming a 3D memory device is provided in some embodiments in accordance with the present disclosure. In the disclosed method, a multi-deposition process can form a laminated spacer layer between the gate structures and the array common source. The laminated spacer layer can include a second spacer sublayer sandwiched by the first spacer sublayer and the third spacer sublayer. The dielectric material of the second spacer sublayer can have a k-value higher than the k-values of the dielectric materials of the first spacer sublayer and the third spacer sublayer. Such laminated structure can efficiently improve the equivalent oxide thickness (EOT) of the spacer layer, thereby improving the isolation performance of the spacer layer. Thus, the improved film quality of the spacer layer can result in a higher breakdown voltage between the gate structures and an array common source.

Embodiments of method for forming gate structures of 3D memory devices and fabrication methods thereof are disclosed herein.

Disclosed is a method for forming a three-dimensional (3D) NAND memory device, comprising: forming, on a substrate, an alternating dielectric stack including a plurality of dielectric layer pairs, each of the plurality of dielectric layer pairs comprising a first dielectric layer and a second dielectric layer different from the first dielectric layer; forming a slit penetrating vertically through the alternating dielectric stack and extending in a horizontal direction; removing the plurality of second dielectric layers in the alternating dielectric stack through the slit to form a plurality of horizontal trenches; forming a gate structure in each of the plurality of horizontal trenches; forming a spacer layer on sidewalls of the slit to cover the gate structures, wherein the spacer layer has a laminated structure; and forming a conductive wall in the slit, wherein the conductive wall is insulated from the gate structures by the spacer layer.

In some embodiments, each of the plurality of dielectric layer pairs is formed of a silicon oxide layer having a thickness of about 10 nm to about 150 nm and a silicon nitride layer having a thickness of about 10 nm to about 150 nm.

In some embodiments, the method further comprises: forming a plurality of channel structures, each penetrating vertically through the alternating dielectric stack; wherein the slit extends horizontally between the plurality of channel structures.

In some embodiments, the method further comprises: after forming the slit, forming a doped region below the slit in the substrate; before forming the conductive wall, removing a portion of the spacer layer at a bottom of the silt to expose the doped region; and forming the conductive wall in the silt, so as to contact the conductive wall with the doped region.

In some embodiments, forming the plurality of channel structures comprises: forming a channel hole extending vertically through the alternating dielectric stack; forming a functional layer on a sidewall of the channel hole; and forming a channel layer covering a sidewall of the functional layer.

In some embodiments, forming the functional layer comprises: forming a barrier layer on a sidewall of the channel hole for blocking an outflow of the electronic charges during operation; forming a storage layer on a surface of the barrier layer for storing electronic charges during operation; and forming a tunneling layer on a surface of the storage layer for tunneling electronic charges during operation.

In some embodiments, the method further comprises: before forming the gate structure in each of the plurality of horizontal trenches, forming an insulating layer in the plurality of horizontal trenches.

In some embodiments, forming the spacer layer comprises: forming a second spacer sublayer having a second dielectric material between a first spacer sublayer having a first dielectric material and a third spacer sublayer having a third dielectric material; wherein a second k-value of the second dielectric material is higher than a first k-value of the first dielectric material and higher than a third k-value of the third dielectric material.

In some embodiments, forming the spacer layer comprises: forming the first spacer sublayer covering the sidewalls of the slit by performing a first atomic layer deposition process to deposit a low temperature oxide material; forming the second spacer sublayer covering the first spacer sublayer by performing a second atomic layer deposition process to deposit a nitride material; and forming the third spacer sublayer covering the second spacer sub-layer by performing a third atomic layer deposition process to deposit a low temperature oxide material or a high temperature oxide material.

In some embodiments, the method further comprises: before forming the spacer layer, removing portions of the gate structures adjacent to the sidewalls of the slit; and forming the first spacer sublayer and the second spacer sublayer each having a plurality of recesses, each recess corresponding to a gate structure.

In some embodiments, the method further comprises: performing an implantation process to treat exposed surfaces of the spacer layer.

In some embodiments, the method further comprises: implanting titanium ions or titanium nitride ions into at least a portion of the third spacer sub-layer.

Another aspect of the present disclosure provides a three-dimensional (3D) NAND memory device, comprising: an alternating dielectric/conductive stack including a plurality of dielectric/conductive layer pairs on a substrate, each of the plurality of dielectric/conductive layer pairs comprising a dielectric layer and a conductive layer; a slit penetrating vertically through the alternating dielectric/conductive stack and extending in a horizontal direction; a conductive wall in the slit; and a spacer layer on sidewalls of the silt configured to insulate the conductive wall from the plurality of conductive layers of the alternating dielectric/conductive stack, wherein the spacer layer has a laminated structure.

In some embodiments, each of the dielectric layers is silicon oxide having a thickness in a range from about 10 nm to about 150 nm; each of the conductive layers is tungsten having a thickness in a range from about 10 nm to about 150 nm; and the conductive wall includes tungsten.

In some embodiments, the device further comprises: a doped region below the slit in the substrate, wherein the conductive wall is in contact with the doped region at a bottom of the slit.

In some embodiments, the device further comprises: a plurality of channel structures, each penetrating vertically through the alternating dielectric/conductive stack; wherein the slit extends horizontally between the plurality of channel structures.

In some embodiments, each of the plurality of channel structures comprises: a channel hole extending vertically through the alternating dielectric/conductive stack; a functional layer on a sidewall of the channel hole; and a channel layer covering a sidewall of the functional layer.

In some embodiments, the functional layer comprises: a barrier layer on a sidewall of the channel hole configured to block an outflow of the electronic charges during operation; a storage layer on a surface of the barrier layer configured to store electronic charges during operation; and a tunneling layer on a surface of the storage layer configured to tunnel electronic charges during operation.

In some embodiments, the device further comprises: an insulating layer between the each dielectric layer and each conductive layer, and between the conductive layers and the functional layer.

In some embodiments, the spacer layer having the laminated structure comprises: a first spacer sublayer having a first dielectric material; a second spacer sublayer having a second dielectric material; and a third spacer sublayer having a third dielectric material; wherein the second spacer is sandwiched between the first spacer sublayer and the third spacer sublayer, and a second k-value of the second dielectric material is higher than a first k-value of the first dielectric material and higher than a third k-value of the third dielectric material.

In some embodiments, the first dielectric material is a low temperature oxide material; the second dielectric material is a nitride material; and the third dielectric material is a low temperature oxide material or a high temperature oxide material.

In some embodiments, the first spacer sublayer and the second spacer sublayer both have a plurality of recesses, each recess corresponding to one of the plurality of conductive layers.

In some embodiments, the device further comprises: an isolation film including titanium or titanium nitride disposed between the third spacer sub-layer and the conductive wall.

Other aspects of the present disclosure can be understood by those skilled in the art in light of the description, the claims, and the drawings of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) NAND memory device, comprising:
an alternating dielectric/conductive stack including a plurality of dielectric/conductive layer pairs on a substrate, each of the plurality of dielectric/conductive layer pairs comprising a dielectric layer and a conductive layer;
a conductive wall vertically penetrating through the alternating dielectric/conductive stack and extending in a horizontal direction; and
a spacer layer on sidewalls of the conductive wall configured to insulate the conductive wall from the plurality of conductive layers of the alternating dielectric/conductive stack, comprising:
a first spacer sublayer having a first dielectric material;
a second spacer sublayer having a second dielectric material;
a third spacer sublayer having a third dielectric material; and
an isolation film having a composite structure including oxide, metal and nitride;
wherein the second spacer sublayer is sandwiched between the first spacer sublayer and the third spacer sublayer, and a second k-value of the second dielectric material is higher than a first k-value of the first dielectric material and higher than a third k-value of the third dielectric material.

2. The device of claim 1, wherein:
each of the dielectric layers is silicon oxide having a thickness in a range from about 10 nm to about 150 nm;
each of the conductive layers is tungsten having a thickness in a range from about 10 nm to about 150 nm; and
the conductive wall includes tungsten.

3. The device of claim 1, further comprising:
a doped region in the substrate below and in contact with the conductive wall.

4. The device of claim 1, further comprising:
a plurality of channel structures; each penetrating vertically through the alternating dielectric/conductive stack;
wherein the conductive wall extends horizontally between the plurality of channel structures.

5. The device of claim 4, wherein each of the plurality of channel structures comprises:
a channel hole extending vertically through the alternating dielectric/conductive stack;
a functional layer on a sidewall of the channel hole; and
a channel layer covering a sidewall of the functional layer.

6. The device of claim 5, further comprising:
an insulating layer between the each dielectric layer and each conductive layer, and between the conductive layers and the functional layer.

7. The device of claim 1, wherein:
the first dielectric material is a low temperature oxide material,
the second dielectric material is a nitride material; and
the third dielectric material is a low temperature oxide material or a high temperature oxide material.

8. The device of claim 1, wherein:
the first spacer sublayer and the second spacer sublayer both have a plurality of recesses, each recess corresponding to one of the plurality of conductive layers.

9. The device of claim 1, wherein:
the isolation film includes silicon oxide, titanium and titanium nitride, and is disposed between the third spacer sublayer and the conductive wall.

10. A three-dimensional (3D) NAND memory device, comprising:
an alternating dielectric/conductive stack including a plurality of dielectric/conductive layer pairs on a substrate, each of the plurality of dielectric/conductive layer pairs comprising a dielectric layer and a conductive layer;
a conductive wall vertically penetrating through the alternating dielectric/conductive stack and extending in a horizontal direction; and
a spacer layer on sidewalls of the conductive wall configured to insulate the conductive wall from the plurality of conductive layers of the alternating dielectric/conductive stack, wherein the spacer layer has a laminated structure, a surface of the laminated structure proximate to the conductive wall comprises an isolation film that has a composite structure including oxide, metal and nitride.

11. The device of claim 10, wherein:
each of the dielectric layers is silicon oxide having a thickness in a range from about 10 nm to about 150 nm;
each of the conductive layers is tungsten having a thickness in a range from about 10 nm to about 150 nm; and
the conductive wall includes tungsten.

12. The device of claim 10, further comprising:
a doped region in the substrate below and in contact with the conductive wall.

13. The device of claim 10, further comprising:
a plurality of channel structures, each penetrating vertically through the alternating dielectric/conductive stack;
wherein the conductive wall extends horizontally between the plurality of channel structures.

14. The device of claim 13, wherein each of the plurality of channel structures comprises:
a channel hole extending vertically through the alternating dielectric/conductive stack;
a functional layer on a sidewall of the channel hole; and
a channel layer covering a sidewall of the functional layer.

15. The device of claim 14, further comprising:
an insulating layer between the each dielectric layer and each conductive layer, and between the conductive layers and the functional layer.

16. The device of claim 11, wherein the spacer layer having the laminated structure comprises:
a first spacer sublayer having a first dielectric material;
a second spacer sublayer having a second dielectric material; and
a third spacer sublayer having a third dielectric material;
wherein the second spacer sublayer is sandwiched between the first spacer sublayer and the third spacer sublayer, and a second k-value of the second dielectric material is higher than a first k-value of the first dielectric material and higher than a third k-value of the third dielectric material.

17. The device of claim 16, wherein:
the first dielectric material is a low temperature oxide material;
the second dielectric material is a nitride material; and
the third dielectric material is a low temperature oxide material or a high temperature oxide material.

18. The device of claim 16, wherein:
the first spacer sublayer and the second spacer sublayer both have a plurality of recesses, each recess corresponding to one of the plurality of conductive layers.

19. The device of claim 16, wherein:
the isolation film includes silicon oxide, titanium and titanium nitride, and is disposed between the third spacer sublayer and the conductive wall.

\* \* \* \* \*